United States Patent
Yamakawa et al.

(12) 
(10) Patent No.: US 8,710,604 B2
(45) Date of Patent: Apr. 29, 2014

(54) MAGNETORESISTIVE ELEMENT AND MANUFACTURING METHOD OF THE SAME

(75) Inventors: Koji Yamakawa, Tokyo (JP); Katsuaki Natori, Yokohama (JP); Daisuke Ikeno, Yokohama (JP); Tadashi Kai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 13/425,309

(22) Filed: Mar. 20, 2012

(65) Prior Publication Data

US 2013/0001716 A1    Jan. 3, 2013

(30) Foreign Application Priority Data

Jun. 30, 2011    (JP) ................. 2011-145846

(51) Int. Cl.
*H01L 29/82* (2006.01)
*G11C 11/02* (2006.01)

(52) U.S. Cl.
USPC ........... 257/421; 257/422; 257/423; 257/424; 257/427; 257/E29.323; 438/3; 365/157; 365/158; 365/171; 365/172; 365/173; 360/324; 360/324.2; 360/326

(58) Field of Classification Search
USPC ........ 257/20, 414, 421–427, E29.323; 438/3; 365/157–158, 171–173; 360/324–326, 360/313
See application file for complete search history.

(56) References Cited

U.S. PATENT DOCUMENTS

| | | | |
|---|---|---|---|
| 7,663,107 B2 | 2/2010 | Taday | |
| 7,768,824 B2 | 8/2010 | Yoshikawa et al. | |
| 7,957,184 B2 | 6/2011 | Yoshikawa et al. | |
| 8,036,025 B2 | 10/2011 | Nagase et al. | |
| 2006/0262594 A1* | 11/2006 | Fukumoto | ...................... 365/158 |
| 2011/0211389 A1 | 9/2011 | Yoshikawa et al. | |
| 2011/0222335 A1 | 9/2011 | Yoshikawa et al. | |
| 2012/0008381 A1 | 1/2012 | Nagase et al. | |

FOREIGN PATENT DOCUMENTS

| | | |
|---|---|---|
| JP | 2008-283207 A | 11/2008 |
| JP | 2009-081216 A | 4/2009 |

OTHER PUBLICATIONS

Shinji Yuasa, et al. "High Tunnel Magnetoresistance at Room Temperature in Fully Epitaxial Fe/MgO/Fe Tunnel Junctions due t Coherent Spin-Polarized Tunneling", Japanese Journal of Applied Physics, vol. 43, No. 4B, 2004, pp. L588-L590.

David D. Djayaprawira, et al. 230% room-temperature magnetoresistance in CoFeB/MgO/CoFeB magnetic tunnel junctions, Applied Physics Letters 86, 09205 (2005).

* cited by examiner

*Primary Examiner* — Jami M Valentine
(74) *Attorney, Agent, or Firm* — Knobbe, Martens, Olson & Bear, LLP

(57) ABSTRACT

In accordance with an embodiment, a magnetoresistive element includes a lower electrode, a first magnetic layer on the lower electrode, a first diffusion prevention layer on the first magnetic layer, a first interfacial magnetic layer on the first metal layer, a nonmagnetic layer on the first interfacial magnetic layer, a second interfacial magnetic layer on the nonmagnetic layer, a second diffusion prevention layer on the second interfacial magnetic layer, a second magnetic layer on the second diffusion prevention layer, and an upper electrode layer on the second magnetic layer. The ratio of a crystal-oriented part to the other part in the second interfacial magnetic layer is higher than the ratio of a crystal-oriented part to the other part in the first interfacial magnetic layer.

3 Claims, 9 Drawing Sheets

MAGNETORESISTIVE ELEMENT AND MANUFACTURING METHOD OF THE SAME

CROSS REFERENCE TO RELATED APPLICATIONS

This application is based upon and claims the benefit of priority from the prior Japanese Patent Application No. 2011-145846, filed on Jun. 30, 2011, the entire contents of which are incorporated herein by reference.

FIELD

Embodiments described herein relate generally to a magnetoresistive element and a manufacturing method of the same.

BACKGROUND

Recently, a magnetic random access memory (MRAM) that uses a tunneling magnetoresistive (TMR) effect has been developed. A magnetoresistive element that includes a magnetic tunnel junction (MTJ) is used for the magnetic random access memory, and this element has a high magnetoresistance change. A currently studied spin injection writing method uses an in-plane magnetization MTJ film and a perpendicular magnetization MTJ film, and allows the miniaturization of the structure of the magnetoresistive element and the reduction of a current. As an MTJ structure, a nonmagnetic layer serving as, for example, a tunnel barrier layer is made of, for example, MgO, and interfacial magnetic layers located on both sides of the tunnel barrier layer are made of CoFeB. In this case, a tunnel current value (resistance value) varies depending on whether the directions of perpendicular magnetization in the CoFeB layers are parallel or antiparallel. A high magnetoresistance (MR) ratio which represents the ratio between the parallel and antiparallel states is obtained.

The tunneling characteristics of an MTJ element depend on the crystallinity and crystalline orientation of the nonmagnetic layer and the interfacial magnetic layers after heat-treated to form a tunnel barrier structure.

However, there are a large number of factors that affect the crystallinity and crystalline orientation of the nonmagnetic layer and the interfacial magnetic layers; for example, the influence from the crystalline orientation of a bottom layer, the deterioration of the crystallinity of the interfacial magnetic layers attributed to element diffusion, and the change of crystallinity attributed to B (boron) element diffusion from the interfacial magnetic layers. It has therefore been not easy to provide a stably operating MTJ element.

DETAILED DESCRIPTION

In accordance with an embodiment, a magnetoresistive element includes a lower electrode, a first magnetic layer on the lower electrode, a first diffusion prevention layer on the first magnetic layer, a first interfacial magnetic layer on the first metal layer, a nonmagnetic layer on the first interfacial magnetic layer, a second interfacial magnetic layer on the nonmagnetic layer, a second diffusion prevention layer on the second interfacial magnetic layer, a second magnetic layer on the second diffusion prevention layer, and an upper electrode layer on the second magnetic layer. The first magnetic layer includes a first metal atom, and the second magnetic layer includes a second metal atom. The first magnetic and interfacial magnetic layers and the second interfacial magnetic and magnetic layers are one and the other of a storage layer and a reference layer. The ratio of a crystal-oriented part to the other part in the second interfacial magnetic layer is higher than the ratio of a crystal-oriented part to the other part in the first interfacial magnetic layer.

Embodiments will now be explained with reference to the accompanying drawings. Like components are given like reference numbers throughout the drawings and repeated explanations thereof are omitted accordingly.

(1) Embodiment 1

(a) Element Configuration

Figure 1:
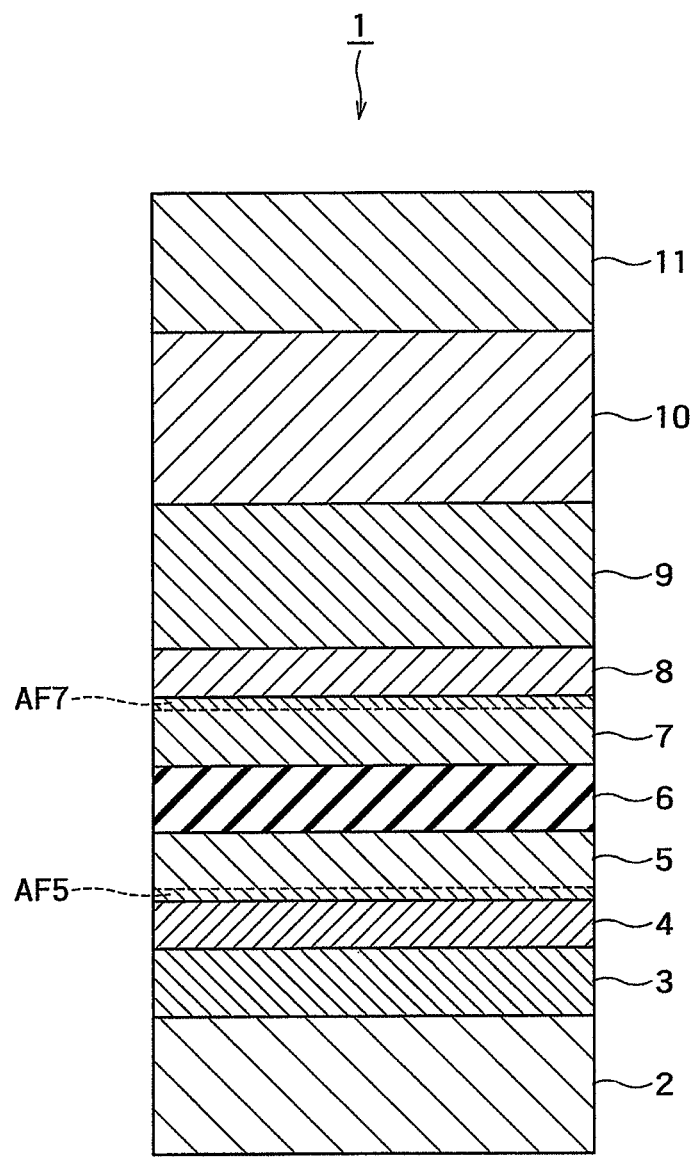
FIG. 1 is a sectional view showing a basic structure of a magnetoresistive element according to Embodiment 1.

FIG. 1 is a sectional view showing the basic structure of a magnetoresistive element 1 according to Embodiment 1. The magnetoresistive element 1 shown in FIG. 1 is an element having a perpendicular magnetization film higher in recording density than an in-plane magnetic film. The magnetoresistive element 1 includes a lower electrode 2, a magnetic layer 3, a first metal layer 4, a first interfacial magnetic layer 5, a nonmagnetic layer 6, a second interfacial magnetic layer 7, a second metal layer 8, a magnetic layer 9, a magnetization adjustment layer 10, and an upper electrode 11. As will be described later, the first and second metal layers 4 and 8 function as diffusion prevention layers to inhibit the diffusion of elements from the magnetic layer 3 and the magnetic layer 9 to the nonmagnetic layer 6. However, the first and second metal layers 4 and 8 can be replaced with a type of film that constitutes a magnetic element or with a mixture.

In the present embodiment, the magnetic layers 3 and 9 correspond to, for example, first and second magnetic layers, respectively. Either layers of the magnetic layer 3 and the interfacial magnetic layer 5, or the interfacial magnetic layer 7 and the magnetic layer 9 constitute a storage layer. The other layers of the magnetic layer 3 and the interfacial magnetic layer 5, and the interfacial magnetic layer 7 and the magnetic layer 9 constitute a reference layer. When the magnetoresistive element 1 according to the present embodiment includes, for example, an MTJ structure having the magnetization reference layer at the bottom, the reference layer is provided on the lower electrode 2 as shown in FIG. 1. For example, Pt, Ir, Ru, or Ta is used as the material of the lower electrode 2.

A structure that uses the crystal orientation of a precious metal allows the orientation of an fcc structure (111) face to be easily obtained. Therefore, this structure may be used. When the influence of crystal matching from a foundation structure provided on a substrate should be eliminated in the lower electrode 2, an amorphous metal film may be provided under the lower electrode 2.

The magnetic layer 9 is a perpendicular magnetic film having its magnetization substantially perpendicular to a film plane, and is variable in magnetization direction. The magnetic layer 3 includes a first metal atom. In the present embodiment, the first metal atom means, for example, a Pt or Pd atom. More specifically, an ordered alloy layer is used for the magnetic layer 3. For example, FePd, FePt, CoPt, or CoPd is used. The thickness of the lower electrode 2 is, for example, about 5 nm. The thickness of the magnetic layer 3 is, for example, about 1 nm. The lower electrode 2 also serves as a layer for controlling the orientation of the magnetic layer 3 formed thereon. The first metal layer 4 is provided on the magnetic layer 3. The first metal layer 4 is made of, for example, Ta, and has a thickness of, for example, about 0.5 nm. In the present embodiment, Ta corresponds to, for example, a third metal atom.

The first interfacial magnetic layer 5 is provided on the first metal layer 4. The first interfacial magnetic layer 5 is formed by using CoFeB as the main component. The first interfacial magnetic layer 5 may include Co, Fe, CoFe, CoFeB, or a stack structure including these materials. The first interfacial magnetic layer 5 has perpendicular magnetization resulting from the exchange coupling between the first interfacial magnetic layer 5 and a perpendicular magnetic film such as the magnetic layer 3. The thickness of the first interfacial magnetic layer 5 is, for example, about 1 nm. The first interfacial magnetic layer 5 includes an amorphous layer AF5 in the vicinity of an interface on the first metal layer 4 side opposite to the nonmagnetic layer 6 side. The amorphous layer AF5 is not transformed into an epitaxial state and remains amorphous. Although the amorphous layer AF5 is shown as a flat film in FIG. 1, the amorphous layer AF5 is actually in a highly rough form or in a form that complements the grains of the interfacial magnetic film.

The nonmagnetic layer 6 is provided on the first interfacial magnetic layer 5 as a tunnel insulating film. The nonmagnetic layer 6 is an oxide having an NaCl structure, and is preferably formed by selecting a material having a low degree of lattice mismatch between the (100) face of the above oxide and the first interfacial magnetic layer 5. As the nonmagnetic layer 6, an insulating film that is preferentially oriented to a [100] direction can be obtained, for example, by crystal growth on an amorphous CoFeB alloy structure. Although, for example, MgO, CaO, SrO, TiO, VO, or NbO is used for the nonmagnetic layer 6, other materials may be used instead. The thickness of the nonmagnetic layer 6 is, for example, about 1 nm. Due to the small thickness, the area resistance value of the magnetoresistive element 1 is set to about 10 $\Omega\mu m^2$ or less.

The nonmagnetic layer 6 is provided on the first interfacial magnetic layer 5 as a tunnel insulating film. The nonmagnetic layer 6 is an oxide having an NaCl structure, and is preferably constituted by selecting a material having a low degree of lattice mismatch between the (100) face of the above oxide and the first interfacial magnetic layer 5. As the nonmagnetic layer 6, an insulating film that is preferentially oriented to a [100] direction can be obtained, for example, by crystal growth on an amorphous CoFeB alloy structure. Although, for example, MgO, CaO, SrO, TiO, VO, or NbO is used for the nonmagnetic layer 6, other materials may be used instead. The thickness of the nonmagnetic layer 6 is, for example, about 1 nm. Due to the small thickness, the resistance value of the magnetoresistive element 1 is set to about 10 $\Omega\mu m^2$ or less.

The second interfacial magnetic layer 7 is provided on the nonmagnetic layer 6. A material similar to the above-mentioned material of the first interfacial magnetic layer 5 is used for the second interfacial magnetic layer 7. The second interfacial magnetic layer 7 has perpendicular magnetization resulting from the exchange coupling between the second interfacial magnetic layer 7 and a perpendicular magnetic film such as the magnetic layer 9. The thickness of the second interfacial magnetic layer 7 is, for example, about 1 nm. The second interfacial magnetic layer 7 also includes an amorphous layer AF7 in the vicinity of an interface on the second metal layer 8 side opposite to the nonmagnetic layer 6 side. The amorphous layer AF7 is not transformed into an epitaxial state and remains amorphous. Although the amorphous layer AF7 is also shown as a flat film in FIG. 1, the amorphous layer AF7 is actually in a highly rough form to complement the interfacial magnetization crystal film. Thus, in the present embodiment, the first and second interfacial magnetic layers respectively include the epitaxial metal layer and the amorphous metal layer, and are therefore referred to as "CoFe (B) layers" in the following explanation.

The second metal layer 8 made of, for example, Ta is provided on the second interfacial magnetic layer 7. The thickness of the second metal layer 8 is, for example, about 0.5 nm.

The magnetic layer 9 is provided on the second metal layer 8. The magnetic layer 9 is a perpendicular magnetic film having its magnetization substantially perpendicular to a film plane. The magnetic layer 9 is variable. The magnetic layer 9 includes a second metal atom. For example, a disordered alloy, an ordered alloy, or artificial lattice is used to form the magnetic layer 9 which is a perpendicular magnetic film. An alloy of Co and an element such as Cr, Ta, Nb, V, W, Hf, Ti, Zr, Pt, Pd, Fe, or Ni is used as the disordered alloy. For example, a CoCr alloy or a CoPt alloy is used. An alloy of Fe, Co, or Ni and Pt or Pd is used as the ordered alloy. Such an alloy includes, for example, FePt, FePd, or CoPt. An Fe, Co, or Ni element, a Cr, Pt, Pd, Ir, Rh, Ru, Os, Re, or Au element, or a stack of alloys of such elements is used as the artificial lattice. For example, Co/Pd, Co/Pt, or Co/Ru is used. It is also possible to use an alloy material including a transition metal such as Tb, Dy, or Gd, TbFe, TbCo, DyTbFeCo, or TbCoFe. The thickness of the magnetic layer 9 is, for example, about 6 nm.

The magnetization adjustment layer 10 is provided on the magnetic layer 9. The magnetization adjustment layer 10 is a magnetic film provided to inhibit the influence of a magnetic field from the reference layer on the magnetic layer 9. For example, FeMn, NiMn, PtMn, PdMn, PtPdMn, RuMn, OsMn, IrMn, or CrPtMn which is an alloy of Fe, Ni, Pt, Pd, Ru, Os, Ir and Mn is used for the magnetization adjustment layer 10. The thickness of the magnetization adjustment layer 10 is, for example, about 8 nm.

The upper electrode (or cap layer) 11 is provided on the magnetization adjustment layer 10. The thickness of the upper electrode 11 is, for example, about 5 nm.

The nonmagnetic layer 6 serving as a tunnel barrier layer is made of MgO in the present embodiment. The first and second interfacial magnetic layers located on both sides of the nonmagnetic layer 6 across the nonmagnetic layer 6 are formed by using CoFeB as the main component in the present embodiment. As the lower first interfacial magnetic layer 5 is formed on the first metal layer 4, the first interfacial magnetic layer 5 reflects the crystal structure and crystal orientation of the metal layer or the crystal structure and orientation of the bottom metal layer under the first metal layer. Thus, desired crystal structure and crystal orientation of CoFe (B) may not be obtained. Spin-polarized tunneling characteristics such as the MR ratio of the MTJ is dependent on the crystallinity and crystal orientation of MgO and CoFe (B), and a CoFe (B) film having bcc (001) orientation that lattice-matches MgO (001) is preferred. Therefore, in order to eliminate the influence of the bottom metal layer, an amorphous condition is preferred in the vicinity of the lower (first metal layer 4 side) interface of the first interfacial magnetic layer 5. The CoFe layer increases in magnetization when increased in thickness, which can be a cause of the deterioration of perpendicular magnetic anisotropy. In this respect, the CoFe layer is preferably not completely crystallized.

Thus, in the present embodiment, the first interfacial magnetic layer 5 includes, in the vicinity of the interface on the first metal layer 4 side opposite to the nonmagnetic layer 6 side, the amorphous layer AF5 which is not transformed into an epitaxial state and remains amorphous. Accordingly, the first interfacial magnetic layer 5 is amply free from the influence of the crystal structure and crystal orientation of the lower first metal layer 4, and has a satisfactory crystal structure and crystal orientation.

On the other hand, the upper second interfacial magnetic layer 7 is formed on MgO and is therefore more easily crystallized than the nonmagnetic layer 6. Thus, the upper second interfacial magnetic layer 7 can have a CoFe crystallized layer that is bcc (001) —oriented in a more satisfactory state than the first interfacial magnetic layer 5. Therefore, the ratio of the part of the second interfacial magnetic layer 7 that is crystal-orientated to the (001) direction is higher than the ratio of the part of the first interfacial magnetic layer 5 that is crystal-orientated to the (001) direction. This can be ascertained if the crystallized area is detected, for example, by using a transmission electron microscope (TEM).

Thus, the first and second interfacial magnetic layers 5 and 7 are crystallized layers that are bcc (001) —oriented in a satisfactory state, and are therefore characterized by being improved in perpendicular magnetic anisotropy and being thermally stable. As the second metal film 8 is provided above the second interfacial magnetic layer 7, the second metal film 8 has small influence on the crystal structure and crystal orientation of the second interfacial magnetic layer 7 despite the difference of crystal structure.

The magnetoresistive element 1 shown in FIG. 1 is structured so that the magnetic layer 3, the first metal layer 4, the first interfacial magnetic layer 5, the nonmagnetic layer 6, the second interfacial magnetic layer 7, the second metal layer 8, the magnetic layer 9, the magnetization adjustment layer 10, and the upper electrode 11 are stacked in this order from the lower side to the upper side. Thus, the magnetization of the magnetic layer 3 can be precisely controlled.

In the present embodiment, both the first interfacial magnetic layer 5 and the second interfacial magnetic layer 7 include the amorphous layers AF5 and AF7 in the vicinity of the interfaces located on the side opposite to the nonmagnetic layer 6 side. However, as the first interfacial magnetic layer 5 and the second interfacial magnetic layer 7 are different in the easiness of crystallization, the lower first interfacial magnetic layer 5 alone may include the amorphous layer AF5.

(b) Manufacturing Method

Now, a method of manufacturing a magnetic random access memory including the magnetoresistive element 1 is shown to describe a method of manufacturing the magnetoresistive element 1 according to Embodiment 1 below.

Figure 2A:
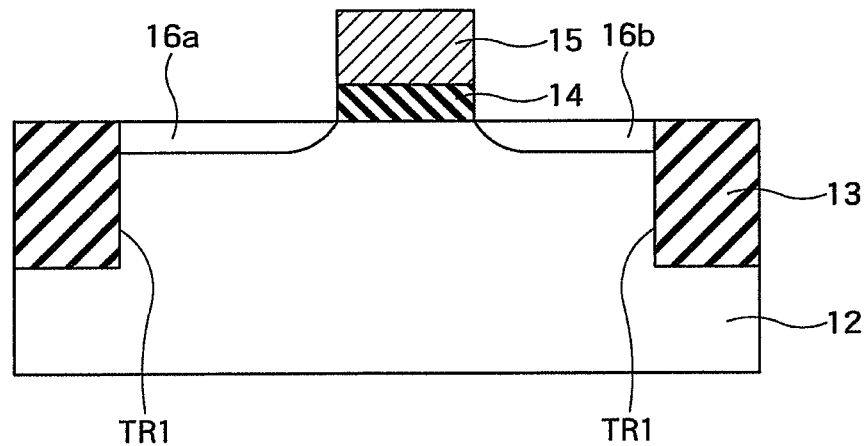
FIG. 2A to FIG. 2D are sectional views showing a method of manufacturing a magnetic random access memory including the magnetoresistive element shown in FIG. 1.

FIG. 2A to FIG. 2D are sectional views showing a method of manufacturing the magnetic random access memory including the magnetoresistive element shown in FIG. 1. First, as shown in FIG. 2A, an element isolation trench TR1 is formed in the surface layer of a semiconductor substrate 12, and the element isolation trench TR1 is filled with an insulating film such as a silicon oxide film. Thereby, an element isolation insulating film 13 having a shallow trench isolation (STI) structure is formed. A gate insulating film 14 and a gate electrode 15 are then formed. A source region 16a and a drain region 16b are then formed by ion implantation and annealing, thereby forming a select transistor. The process described above can be carried out by using an existing technique.

Figure 2B:
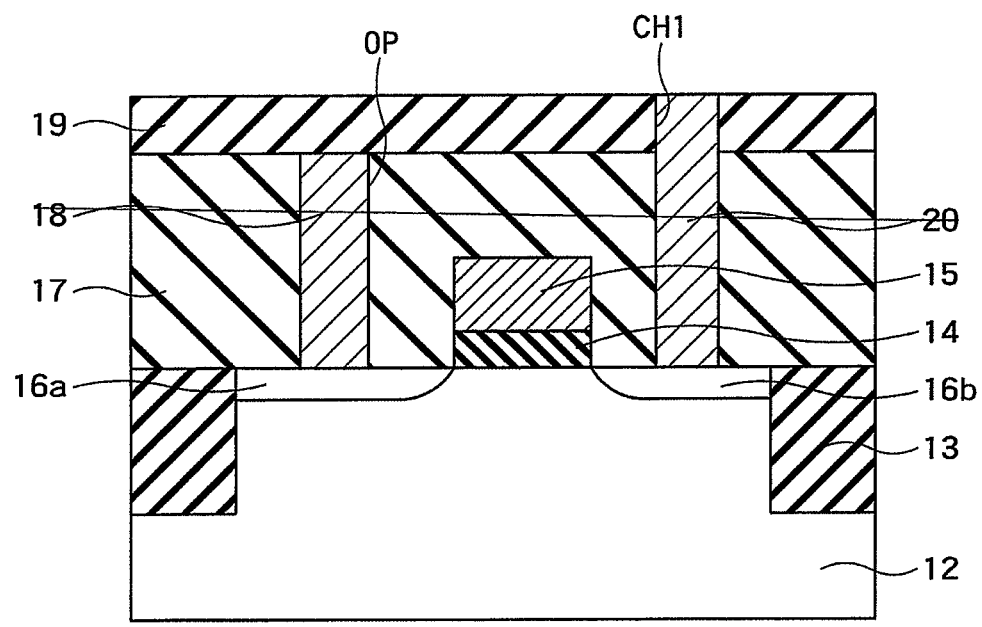

As shown in FIG. 2B, for example, a silicon oxide film is then formed all over the select transistor as a first insulating film 17 by plasma chemical vapor deposition (CVD). Further, an opening OP is formed by a photolithographic method and reactive ion etching (RIE) so that a part of the source region 16a is exposed. A W (tungsten) film is then formed all over in the opening OP by a sputtering method or by CVD under forming gas atmosphere. Further, this W film is planarized by chemical mechanical polishing (CMP). In this way, a first contact plug 18 that communicates with the source region 16a is formed in the silicon oxide film 17. The gate electrode 15 is connected to an unshown word line. The source region 16a is connected to an unshown bit line.

A CVD nitride film 19 is then formed all over the silicon oxide film 17 and the first contact plug 18 by the CVD method. Further, a contact hole CH1 that communicates with the drain region 16b is formed, and a W film is formed. The W film is then planarized by CMP to form a second contact plug 20. The second contact plug 20 serves as a leader line to connect the drain region 16b to the magnetoresistive element 1.

Figure 3A:
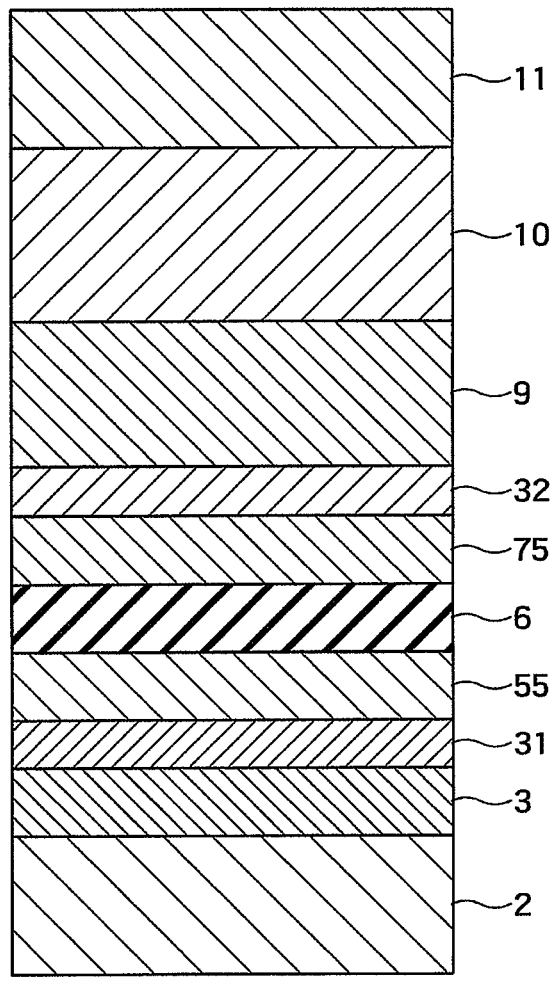
FIG. 3A is a sectional view showing a method of manufacturing the magnetoresistive element shown in FIG. 1.

The magnetoresistive element 1 is then formed. A method of forming the magnetoresistive element 1 is specifically described below with reference to FIG. 3A and FIG. 3B.

Ru of about 5 nm in thickness is formed on the second contact plug 20 as a lower electrode 2.

Other materials that may be used for the lower electrode 2 include Pt, Ru, or Ir.

A CoPd layer of about 1 nm in thickness is then formed on the lower electrode 2 as a magnetic layer 3. Further, for example, a Ta layer of about 0.5 nm in thickness is formed on the magnetic layer 3 as a diffusion prevention layer 31. An atom selected from the group consisting of V, Y, Zr, Yb, Ti, W, and Mo is otherwise used as the material of the diffusion prevention layer 31.

In the present embodiment, the diffusion prevention layer 31 corresponds to, for example, a first diffusion prevention layer.

An amorphous CoFeB layer 55 of about 1 nm in thickness is then formed on the diffusion prevention layer 31 to form a first interfacial magnetic layer 5. In the present embodiment, the CoFeB layer 55 corresponds to, for example, a first amorphous metal layer, Co corresponds to, for example, a first metal, and B corresponds to, for example, a first substance. The first substance includes, for example, P in addition to B.

A partly crystalline tunnel film made of MgO of about 1 nm in thickness is then formed on the CoFeB layer 55 as a nonmagnetic layer 6. An amorphous CoFeB layer 75 of about 1 nm in thickness is formed to form a second interfacial magnetic layer 7 on the nonmagnetic layer 6.

Ta is then deposited on the CoFeB layer 75 to form a second metal layer 32 of about 0.5 nm in thickness. Thereon, an FePd layer of about 6 nm in thickness is formed as a magnetic layer 9. Instead of Ta, the second metal layer 32 may include an atom selected from the group consisting of V, Y, Zr, Yb, W, Mo, and Ti. In the present embodiment, the second metal layer 32 corresponds to, for example, a second diffusion layer.

A PtMn layer of about 8 nm in thickness is then formed on the magnetic layer 9 as a magnetization adjustment layer 10.

An Ru layer of about 5 nm in thickness is formed on the magnetization adjustment layer 10 as an upper electrode 11. For example, Pt, Ir, or Ta is otherwise used as the material of the upper electrode 11. The upper electrode 11 may be formed immediately on the magnetic layer 9 without forming the magnetization adjustment layer 10.

The layers constituting the magnetoresistive element 1 are formed through the manufacturing process described above. It should be understood that the layers constituting the magnetoresistive element 1 are not exclusively stacked in the above-mentioned order. The lower electrode 2, the magnetization adjustment layer 10, the magnetic layer 9, the first metal layer 31, the first CoFeB layer 55, the nonmagnetic layer 6, the second CoFeB layer 75, the second metal layer 32, the magnetic layer 3, and the upper electrode 11 may be stacked in this order.

In the process described above, the lower electrode 2, the magnetic layer 3, the first metal layer 31, the first CoFeB layer 55, the nonmagnetic layer 6, the second CoFeB layer 75, the second metal layer 32, the magnetic layer 9, the magnetization adjustment layer 10, and the upper electrode 11 can be formed by, for example, the sputtering method.

Annealing is then carried out in a vacuum at 300° C. to 350° C. for about one hour. This facilitates the crystallinity of MgO that constitutes the nonmagnetic layer 6. Moreover, B is discharged by the annealing from the first CoFeB layer 55 and the second CoFeB layer 75 to the first and second metal layers 31 and 32, and becomes CoFe crystal to serve as the first and second interfacial magnetic layers 5 and 7, respectively. However, B in parts of the first CoFeB layer 55 and the second CoFeB layer 75 is not discharged and remains at the interface between the first and second metal layers 31 and 32 and becomes the amorphous layers AF5 and AF7 in this part (see FIG. 1). This annealing may be carried out under nitrogen atmosphere. Lamp annealing may be carried out in a vacuum at 400° C. for about 10 to 30 seconds by rapid thermal annealing (RTA).

There are specifically two ways to prevent the partial discharge of B. The first way is to include different concentrations of B in the process of forming the first CoFeB layer 55 and the second CoFeB layer 75. More specifically, the concentration of B in the lower first CoFeB layer 55 is made higher than the concentration of B in the upper second CoFeB layer 75 because a higher concentration of B in the first CoFeB layer 55 inhibits crystallization. The second way is to include different ratios of Fe in the process of forming the first CoFeB layer 55 and the second CoFeB layer 75. More specifically, the ratio of Fe in the upper second CoFeB layer 75 is made higher than the ratio of Fe in the lower first CoFeB layer 55 because a higher ratio of Fe in CoFeB facilitates crystallization. In the present embodiment, Fe corresponds to, for example, a second metal. In each way, the amorphous metal layers AF5 and AF7 remain at the interfaces of the first and second CoFeB layers 55, 75 located on the side opposite to the nonmagnetic layer 6, respectively.

As a result of this annealing, alloys are formed by an atom such as a Pd atom constituting the magnetic layer 3 and the magnetic layer 9 and by an atom such as a Ti atom constituting the first metal layer 31 and the second metal layer 32. These alloys serve as the first metal layer 4 and the second metal layer 8, respectively. Thus, it is possible to obtain the magnetoresistive element 1 capable of inhibiting the diffusion of the atoms to the nonmagnetic layer 6 and capable of stable operation even after a thermal treatment.

Figure 3B:
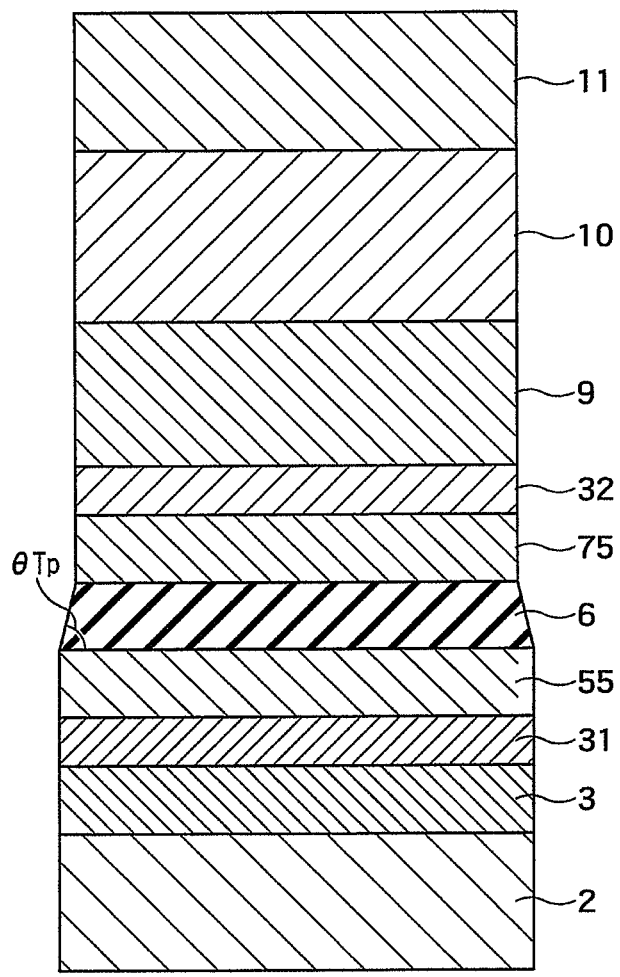
FIG. 3B is a sectional view showing a modification of the method shown in FIG. 3A.

In the structure of the magnetoresistive element 1 formed as described above, a hard mask (not shown) is formed so that the magnetoresistive element 1 on the second contact plug 20 will remain. The upper electrode 11, the magnetization adjustment layer 10, the magnetic layer 9, the second metal layer 8, the second interfacial magnetic layer 7, the nonmagnetic layer 6, the first interfacial magnetic layer 5, the first metal layer 4, the magnetic layer 3, and the lower electrode 2 are etched and thereby fabricated by a lithographic method and ion beam etching (IBE) or RIE. The hard mask used here includes, for example, an Si oxide film, an Si nitride film, and a Ta film. In this case, a metal and the like are used in the magnetoresistive element 1, so that when, for example, the MgO film used as the nonmagnetic layer 6 is thin, residual adheres to the side surface of the nonmagnetic layer 6 due to the etching, and a leak current may be generated in the magnetoresistive element 1. Accordingly, it is necessary to control a taper angle in the part of the nonmagnetic layer 6. This taper angle is preferably 80 degrees or more, in particular, 85 degrees or more, as shown in FIG. 3B.

An oxygen or hydrogen diffusion prevention layer (not shown) is then formed by atomic layer deposition (ALD), CVD, or physical vapor deposition (PVD). For example, SiN or AlOx can be used for this prevention film.

Figure 2C:
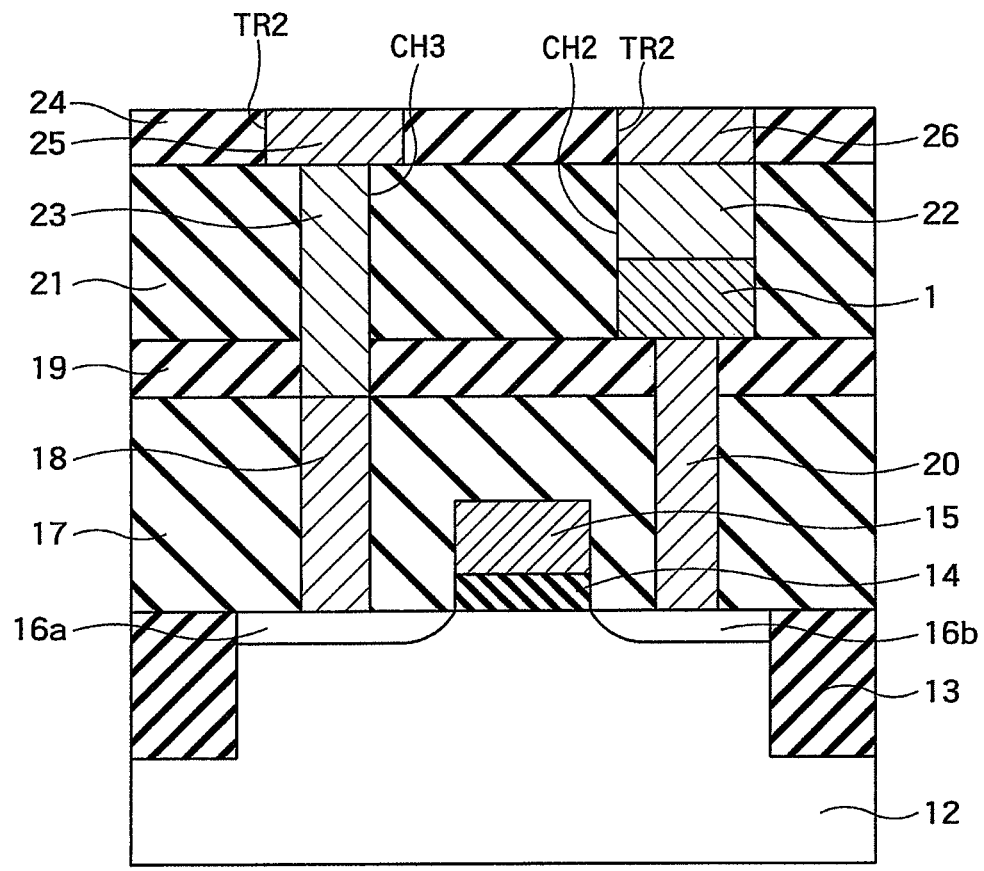

As shown in FIG. 2C, for example, a silicon oxide film 21 is then formed by the CVD method on the CVD nitride film 19 as a second insulating film to cover the magnetoresistive element 1.

Furthermore, a third contact plug 22 connected to the upper electrode 11 of the magnetoresistive element 1 is formed, and a fourth contact plug 23 connected to the first contact plug 18 is formed. In this case, the silicon oxide film 21 is fabricated by the lithographic method and RIE so that contact holes CH2 and CH3 are formed. The contact holes are then filled with Al, and the contact plugs are formed by CMP.

A silicon oxide film 24 is then formed on the silicon oxide film 21, the third contact plug 22, and the fourth contact plug 23. Furthermore, the silicon oxide film 24 is fabricated by the lithographic method and RIE so that the third contact plug 22 and the fourth contact plug 23 is exposed, thereby forming a trench TR2 for forming first wiring lines 25 and 26. The trench TR2 is then filled with Al, and the first wiring lines 25 and 26 are formed by CMP.

Figure 2D:
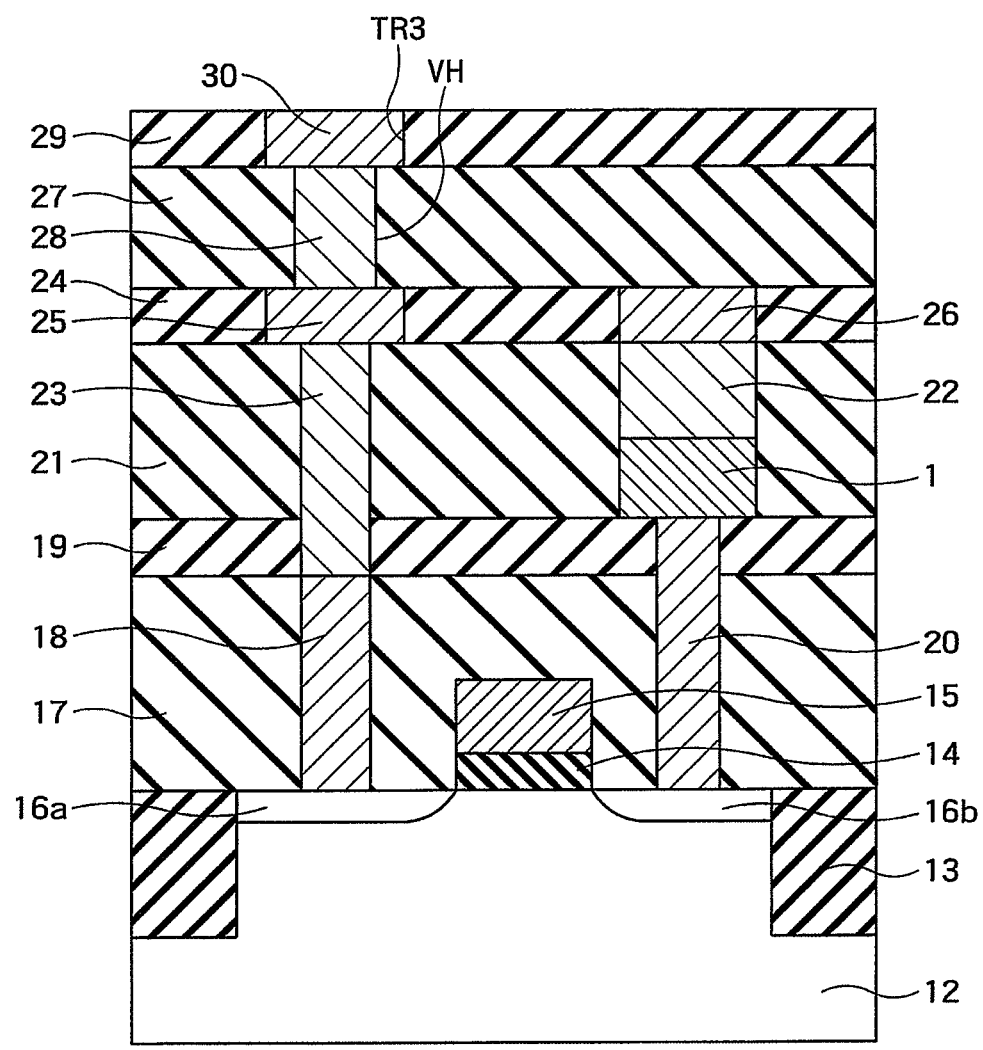

As shown in FIG. 2D, an insulating film 27 is then formed on the silicon oxide film 24 and the first wiring lines 25 and 26. Furthermore, the insulating film 27 is fabricated by the lithographic method and RIE so that the first wiring line 25 is exposed, thereby forming a via hole VH. This via hole VH is then filled with Al, and a via plug 28 is formed by CMP.

A silicon oxide film 29 is then formed on the insulating film 27 and the via plug 28. Furthermore, the silicon oxide film 29 is fabricated by the lithographic method and RIE so that the via plug 28 is exposed, thereby forming a trench TR3. The trench TR3 is then filled with Al, and a second wiring line 30 is formed by CMP.

A Cu wiring line may be formed by using a damascene process. In this case, a barrier film and a seed layer made of, for example, SiN, Ta, TaN, Ru, or Cu are formed, and wiring lines are formed by a filling process using Cu plating.

The magnetic random access memory including the magnetoresistive element according to Embodiment 1 is provided by the process described above.

A referential example in which the first metal layer 4 and the second metal layer 8 are not provided is shown to describe the magnetic characteristics of the magnetoresistive element 1 according to the present embodiment. In the referential example and the present embodiment, a heat treatment is conducted at 350° C. for 30 minutes, and a vibrating sample magnetometer (VSM) is used to apply a magnetic field in a direction perpendicular to each magnetoresistive element to measure the magnetization characteristics. The measurements are shown in FIG. 4A and FIG. 4B.

Figure 4A:
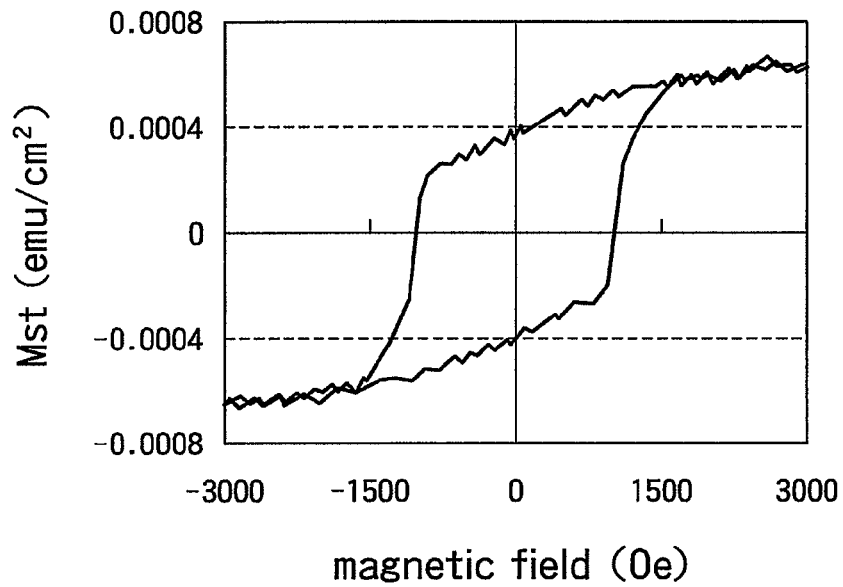
FIG. 4A is a graph showing magnetization curves of the magnetoresistive element according to a referential example.
Figure 4B:
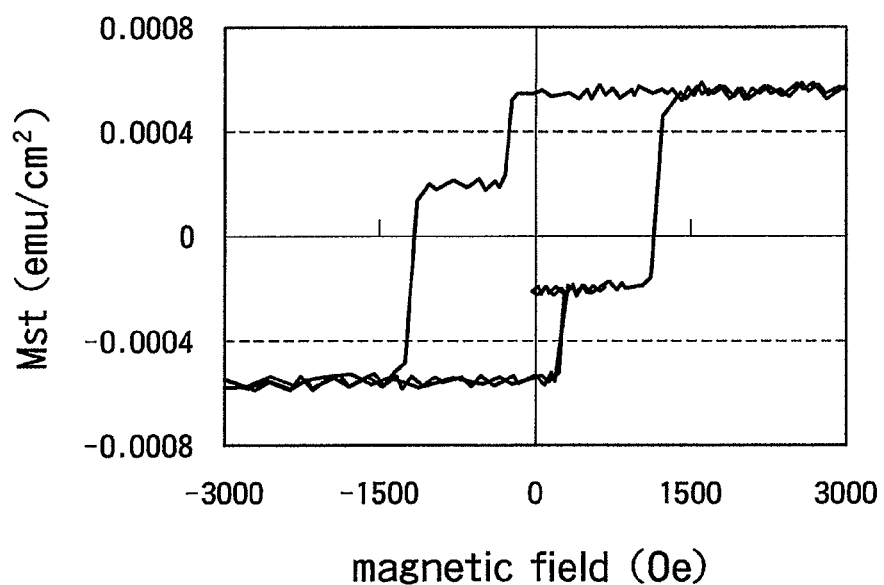
FIG. 4B is a graph showing magnetization curves of the magnetoresistive element according to Embodiment 1.

In each of the graphs shown in FIG. 4A and FIG. 4B, the horizontal axis indicates the intensity of the external magnetic field applied to the magnetoresistive element, and the vertical axis indicates the intensity of the magnetization in the magnetoresistive element. As apparent from FIG. 4A, in the referential example, the intensity of the magnetic field necessary to switch the magnetization in the magnetic layer 3 varies, and preferred magnetization characteristics are not obtained. On the other hand, as apparent from FIG. 4B, in the present embodiment, the intensity of the magnetic field necessary to switch the magnetization in the magnetic layer 3 is fixed, and desired magnetization characteristics are obtained. This is attributed to the diffusion prevention layers 31 and 32 which inhibit the diffusion of the Pd atoms to the nonmagnetic layer 6 from the magnetic layer 3 and the magnetic layer 9 in the heat treatment during the manufacturing process.

According to the present embodiment, an electric characteristic evaluation including an RA value of 10 $\Omega cm^2$ and a magnetoresistance (MR) ratio of 100% or more is obtained.

Although the present embodiment has been described on the assumption that the first metal layer 4 and the second metal layer 8 are provided, one of the first metal layer 4 and the second metal layer 8 does not have to be provided. In this case, manufacturing costs can be reduced by reducing the manufacturing process of the magnetic random access memory.

(2) Embodiment 2

(a) Element Configuration

Figure 5:
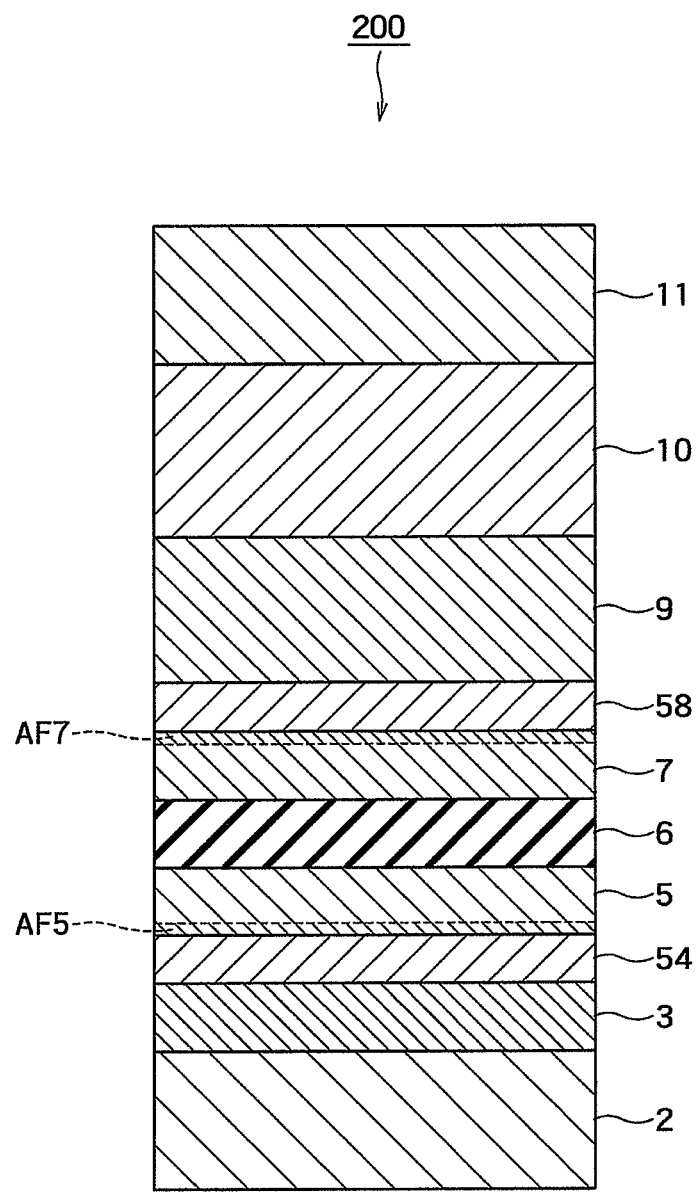
FIG. 5 is a sectional view showing the basic structure of a magnetoresistive element according to Embodiment 2.

FIG. 5 is a sectional view showing the basic structure of a magnetoresistive element according to Embodiment 2. A magnetoresistive element 200 according to the present embodiment is also an element having a perpendicular magnetization film. As apparent from the contrast with FIG. 1, the magnetoresistive element 200 shown in FIG. 5 includes diffusion prevention layers 54 and 58 instead of the first and second metal layers 4 and 8 in FIG. 1. The configuration of the magnetoresistive element 200 is substantially the same in other respects as that of the magnetoresistive element 1 shown in FIG. 1. However, the magnetization storage layer and the magnetization reference layer are reversed as compared with Embodiment 1.

Each of the diffusion prevention layers 54 and 58 is made of a metal such as Mo, W, or Zr that does not easily combine with B, and has a thickness of about 0.5 nm.

(b) Manufacturing Method

Figure 6:
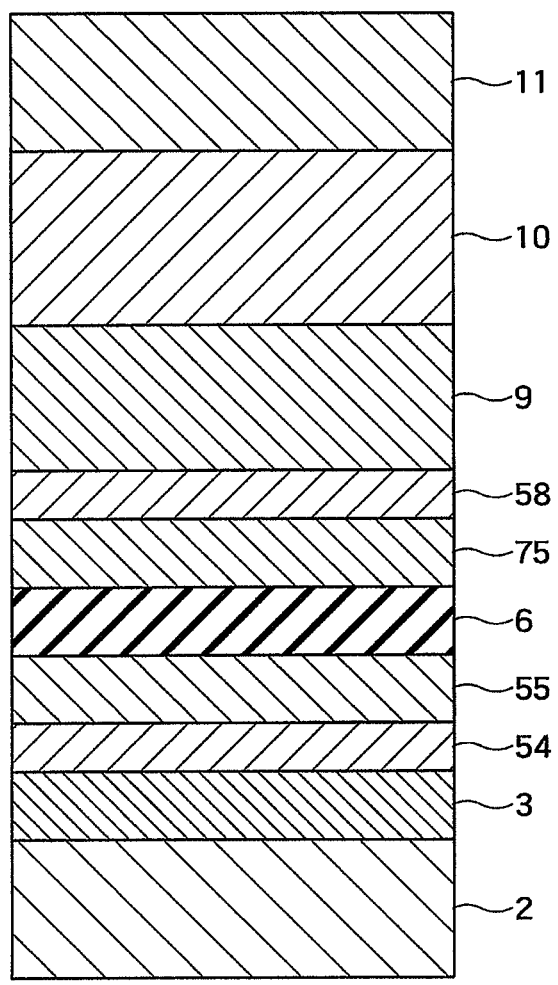
FIG. 6 is a sectional view showing a method of manufacturing the magnetoresistive element shown in FIG. 5.

FIG. 6 is a sectional view showing a method of manufacturing the magnetoresistive element 200 shown in FIG. 5. As apparent from the contrast with FIG. 3A, diffusion prevention layers 54 and 58 are formed instead of the diffusion prevention layers 31 and 32 in FIG. 3A in the present embodiment. More specifically, a metal such as Mo, W, or Zr that does not easily combine with B is used to form a film of about 0.5 nm in thickness. The process for manufacturing the magnetoresistive element 200 is substantially the same in other respects as the manufacturing method according to Embodiment 1 described above.

In the present embodiment, the diffusion prevention layers 54 and 58 are made of a metal that does not easily combine with B. Therefore, due to subsequent annealing, B in parts of the first CoFeB layer 55 and the second CoFeB layer 75 is not discharged to the diffusion prevention layers 54 and 58 and remains at the interface between the diffusion prevention layers 54 and 58 and becomes amorphous layers AF5 and AF7 in this part (see FIG. 5).

The diffusion prevention layers 54 and 58 inhibit the diffusion of atoms such as Pd atoms constituting the magnetic layer 3 and the magnetic layer 9 to the nonmagnetic layer 6 in the above-mentioned annealing. Thus, it is possible to obtain the magnetoresistive element 200 capable of stable operation even after a thermal treatment.

Although both the diffusion prevention layers 54 and 58 are provided in the present embodiment, the lower diffusion prevention layer 54 alone may be provided because of the difference in the easiness of crystallization.

According to each of the magnetoresistive elements described above in Embodiments 1 and 2, the first and second interfacial magnetic layers 5 and 7 respectively include the amorphous layers AF5 and AF7 in the vicinity of the interfaces on the first metal layer 4 side and the second metal layer 8 side opposite to the nonmagnetic layer 6 side. Accordingly, the first and second interfacial magnetic layers 5 and 7 are amply free from the influence of the crystal structure and crystal orientation of the lower first metal layer 4, and have satisfactory crystal structures and crystal orientation. Thus, it is possible to provide a magnetoresistive element which is improved in perpendicular magnetic anisotropy and which is capable of stable operation.

Furthermore, each of the methods of manufacturing the magnetoresistive elements in Embodiments 1 and 2 described above includes the annealing process for conducting a heat treatment so that B in parts of the first CoFeB layer 55 and the second CoFeB layer 75 is not discharged and remains at the interface between the diffusion prevention layers 31 and 32 and becomes the amorphous layers AF5 and AF7 in this part. Therefore, the first and second interfacial magnetic layers 5 and 7 having satisfactory crystal structures and crystal orientations are formed. Thus, it is possible to manufacture a magnetoresistive element which is improved in perpendicular magnetic anisotropy and which is capable of stable operation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
   a lower electrode;
   a first magnetic layer on the lower electrode;
   a first diffusion prevention layer on the first magnetic layer;
   a first interfacial magnetic layer on the first diffusion prevention layer;
   a nonmagnetic layer on the first interfacial magnetic layer;
   a second interfacial magnetic layer on the nonmagnetic layer;
   a second diffusion prevention layer on the second interfacial magnetic layer;
   a second magnetic layer on the second diffusion prevention layer; and
   an upper electrode layer on the second magnetic layer,
   wherein
   the first magnetic layer, the first diffusion prevention layer, the first interfacial magnetic layer, the nonmagnetic layer, the second interfacial magnetic layer, the second diffusion prevention layer, and the second magnetic layer are sequentially stacked in this order from the lower electrode to the upper electrode layer, and wherein each of the first and second interfacial magnetic layers comprises Co and Fe, and a ratio of Fe in the second interfacial magnetic layer is higher than a ratio of Fe in the first interfacial magnetic layer.

2. The element of claim 1, wherein the first and second diffusion prevention layers are made of Mo, W, or Zr.

3. The element of claim 1, wherein the first and second interfacial magnetic layers comprise crystal-oriented parts, respectively, and wherein the ratio of the crystal-oriented part and the other part in the second interfacial magnetic layer is higher than the ratio of the crystal-oriented part and the other part in the first interfacial magnetic layer.

* * * * *